US010359946B1

(12) United States Patent
Chai et al.

(10) Patent No.: US 10,359,946 B1
(45) Date of Patent: Jul. 23, 2019

(54) SYSTEMS AND METHODS FOR OPERATING A FLASH MEMORY IN AN INTEGRATED CIRCUIT

(71) Applicant: Altera Corporation, San Jose, CA (US)

(72) Inventors: Chung Shien Chai, Georgetown (MY); Christine Siu Zhen Chuah, Taiping (MY)

(73) Assignee: Altera Corporation, San Jose, CA (US)

( * ) Notice: Subject to any disclaimer, the term of this patent is extended or adjusted under 35 U.S.C. 154(b) by 93 days.

(21) Appl. No.: 15/342,993

(22) Filed: Nov. 3, 2016

Related U.S. Application Data

(60) Provisional application No. 62/331,030, filed on May 3, 2016.

(51) Int. Cl.

| | |
|---|---|
| ***G06F 3/06*** | (2006.01) |
| ***G11C 16/14*** | (2006.01) |
| ***G11C 16/34*** | (2006.01) |
| ***G11C 16/24*** | (2006.01) |
| ***G06F 13/40*** | (2006.01) |
| ***G06F 13/42*** | (2006.01) |

(52) U.S. Cl.
CPC .......... *G06F 3/0613* (2013.01); *G06F 3/0652* (2013.01); *G06F 3/0656* (2013.01); *G06F 3/0688* (2013.01); *G06F 13/4068* (2013.01); *G06F 13/4282* (2013.01); *G11C 16/14* (2013.01); *G11C 16/24* (2013.01); *G11C 16/3436* (2013.01); *G06F 2213/0042* (2013.01)

(58) Field of Classification Search
CPC ............................................ G06F 12/00–12/16
See application file for complete search history.

(56) References Cited

U.S. PATENT DOCUMENTS

| | | | | |
|---|---|---|---|---|
| 6,651,199 | B1 | 11/2003 | Shokouhi | |
| 7,265,578 | B1 | 9/2007 | Tang et al. | |
| 2008/0082731 | A1* | 4/2008 | Karamcheti | G06F 13/1657 711/103 |
| 2010/0313065 | A1* | 12/2010 | Feeley | G06F 12/0246 714/6.12 |
| 2012/0284587 | A1* | 11/2012 | Yu | G06F 3/0608 714/773 |

OTHER PUBLICATIONS

Arasan Chip Systems Inc., "Datasheet ONFI NAND 4.0 Total IP Solution", Sep. 3, 2015.*
Altera Corp., "In-System Programmability in MAX Devices," Application Note 95, ver. 1.5, Sep. 2005, pp. 1-11.
Altera Corp., "In-System Programmability Guidelines," Application Note 100, Sep. 2014, pp. 1-18.
Altera Corp., "JTAG and In-System Programmability," MAX II Device Handbook, Oct. 2008, pp. 1-8.

* cited by examiner

*Primary Examiner* — Nicholas J Simonetti

(57) ABSTRACT

A flash memory operating circuit in an integrated circuit includes a buffer memory and a speed mode intellectual property (IP) block. The speed mode IP block is communicatively coupled to the buffer memory. The speed mode IP block performs a flash memory operation on a flash memory in the integrated circuit.

20 Claims, 6 Drawing Sheets

SYSTEMS AND METHODS FOR OPERATING A FLASH MEMORY IN AN INTEGRATED CIRCUIT

CROSS REFERENCE TO RELATED APPLICATION

This application claims the benefit of U.S. Provisional Patent Application No. 62/331,030, filed May 3, 2016, which is incorporated by reference herein in its entirety.

FIELD OF DISCLOSURE

The present disclosure relates to electronic circuits, and more particularly, to systems and methods for operating a flash memory in an integrated circuit.

BACKGROUND

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section.

In-System Programmable (ISP) Flash memory devices are programmable logic devices (PLDs) that make use of electrically erasable and programmable Flash memory cells and are capable of being programmed or re-programmed while mounted on a system board. ISP refers to the entire process of programming a device in-system, and, therefore, encompasses the actions of erasing and verifying the design in the device in addition to the specific action of memory cell programming. ISP allows for speedier product development and facilitates the process of improving a PLD in a system.

Some ISP Flash devices contain a so-called Joint Test Action Group (JTAG) interface through which a user can program the device. This interface is a standard specified in "Institute of Electrical and Electronics Engineers (IEEE) Standard Test Access Port and Boundary-Scan Architecture", IEEE Std 1149.1-1990 (includes IEEE Std 1149.1a-1993), published by the Institute of Electrical and Electronics Engineers, Inc. on Oct. 21, 1993. The JTAG standard creates a means of verifying the integrity of traces between components on an assembled printed circuit board by providing a standard architecture and a set of mandatory public instructions that all vendors claiming conformance to IEEE standard 1149.1 must support. A JTAG bus is a serial test bus that adds a Test Access Port (TAP) consisting of four pins to an integrated circuit (IC) or PLD (or five pins with an additional optional RESET pin). The four mandatory signals comprising the JTAG TAP are Test Clock (TCK), Test Mode Select (TMS), Test Data Input (TDI), and Test Data Output (TDO). JTAG provides access to interconnected digital cells on an IC with a method of access for test and diagnostics and the ability to do factory and remote testing and diagnostics. Furthermore, JTAG ISP also provides for software debugging and reducing "No-Fault-Found" problems.

JTAG ISP has several limitations that affect the time taken to perform the flash memory operations like read, write, and erase. One limitation is that the hardware programming cable protocol control and the handshaking mechanism between host machine and endpoint that is utilized in the PLD may introduce performance penalties in performing the flash memory operations. Even when using Universal Serial Bus (USB) protocol for USB Blaster or Ethernet protocol for Ethernet Blaster, performance may be limited by the JTAG frequency that a PLD device supports. In a typical set up JTAG ISP sends data through TDI pin in serial and receives data through TDO pin in serial. Therefore, single bit data transaction may not optimize potential flash programming performance. Furthermore, JTAG ISP provides no feedback to indication the completion of programming operations. Thus, the external host that is programming the flash through JTAG may have to wait the maximum time provided by manufacturer of the PLD device for programming every word. JTAG ISP is also not optimized to support multiple PLD chains through a single host. For example, a customer may wish to program four boards using a USB Blaster, where each board includes a PLD and a single device JTAG chain. The customer can either use four hosts (which may be computer systems) to optimize flash programming performance. However, this increases the cost of running multiple flash memory operations. The customer may also use a single host to connect the four JTAG chains (assuming there are no hardware USB-port limitations). However, sharing host resources over multiple endpoints may drastically reduce performance.

SUMMARY

Embodiments described herein include a method of dividing a set of components of an integrated circuit. It should be appreciated that the embodiments can be implemented in numerous ways, such as a process, an apparatus, a system, a device, or a method. Several embodiments are described below.

In one embodiment, a flash memory operating circuit in an integrated circuit is disclosed. The flash memory operating circuit may include a buffer memory. The flash memory operating circuit may also include a speed mode intellectual property (IP) block such that the speed mode IP block is communicatively coupled to the buffer memory. Further, the speed mode IP block may perform one or more flash memory operations on a flash memory in the integrated circuit.

In an embodiment, the method may also include an operation to receive a feedback signal from the flash memory using the speed mode IP block such that the feedback signal indicates that the flash memory operation is complete. In an embodiment, the feedback signal further indicates that the speed mode IP block is ready to execute a subsequent flash memory operation.

In an embodiment, the flash memory operation indicated by a flash memory operation flag may further include erasing the flash memory, programming the flash memory with the programming data, and verifying data stored in the flash memory.

In another embodiment, a method of performing a flash memory operation on an integrated circuit is disclosed. The method may include an operation to check availability of programming data in a buffer memory in the integrated circuit using a speed mode IP block in the integrated circuit. The method may also include an operation to check a flash memory operation flag using the speed mode IP block such that the flash memory operation flag determines the flash memory operation to be performed by the speed mode IP block on a flash memory in the integrated circuit. The method may further include an operation to drive a flash memory operation signal to the flash memory using the speed mode IP block. The method may include an operation to execute the flash memory operation on each sector of the flash memory using the speed mode IP block.

In still another embodiment, a system for programming a flash memory in an integrated circuit is disclosed. The system may include a computer system such that the computer system is communicatively coupled to the integrated circuit, and such that the computer system sends flash memory operation flags and programming data to the integrated circuit. The system may also include flash memory operating circuitry communicatively coupled to the flash memory. The flash memory operating circuitry may further include a buffer memory such that the buffer memory stores the programming data received from the computer system. The flash memory operating circuitry may also include a speed mode intellectual property (IP) block such that the speed mode IP block performs flash memory operations on the flash memory according to the programming data and the flash memory operation flags received from the computer system.

Further features of the present invention, its nature, and various advantages will be more apparent from the accompanying drawings and the following detailed description of the preferred embodiments.

DETAILED DESCRIPTION OF THE DRAWINGS

Embodiments of the present invention relate to integrated circuits with logic circuitry. The integrated circuits may be any suitable type of integrated circuit, such as microprocessors, application-specific integrated circuits, digital signal processors, memory circuits, or other integrated circuits. If desired, the integrated circuits may be programmable integrated circuits that contain programmable logic circuitry. The present invention will generally be described in the context of integrated circuits such as programmable logic device (PLD) integrated circuits as an example. In the following description, the terms 'circuitry' and 'circuit' are used interchangeably.

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Several features are described hereafter that can each be used independently of one another or with any combination of other features. However, any individual feature may not address any of the problems discussed above or might only address one of the problems discussed above. Some of the problems discussed above might not be fully addressed by any of the features described herein.

Figure 1:
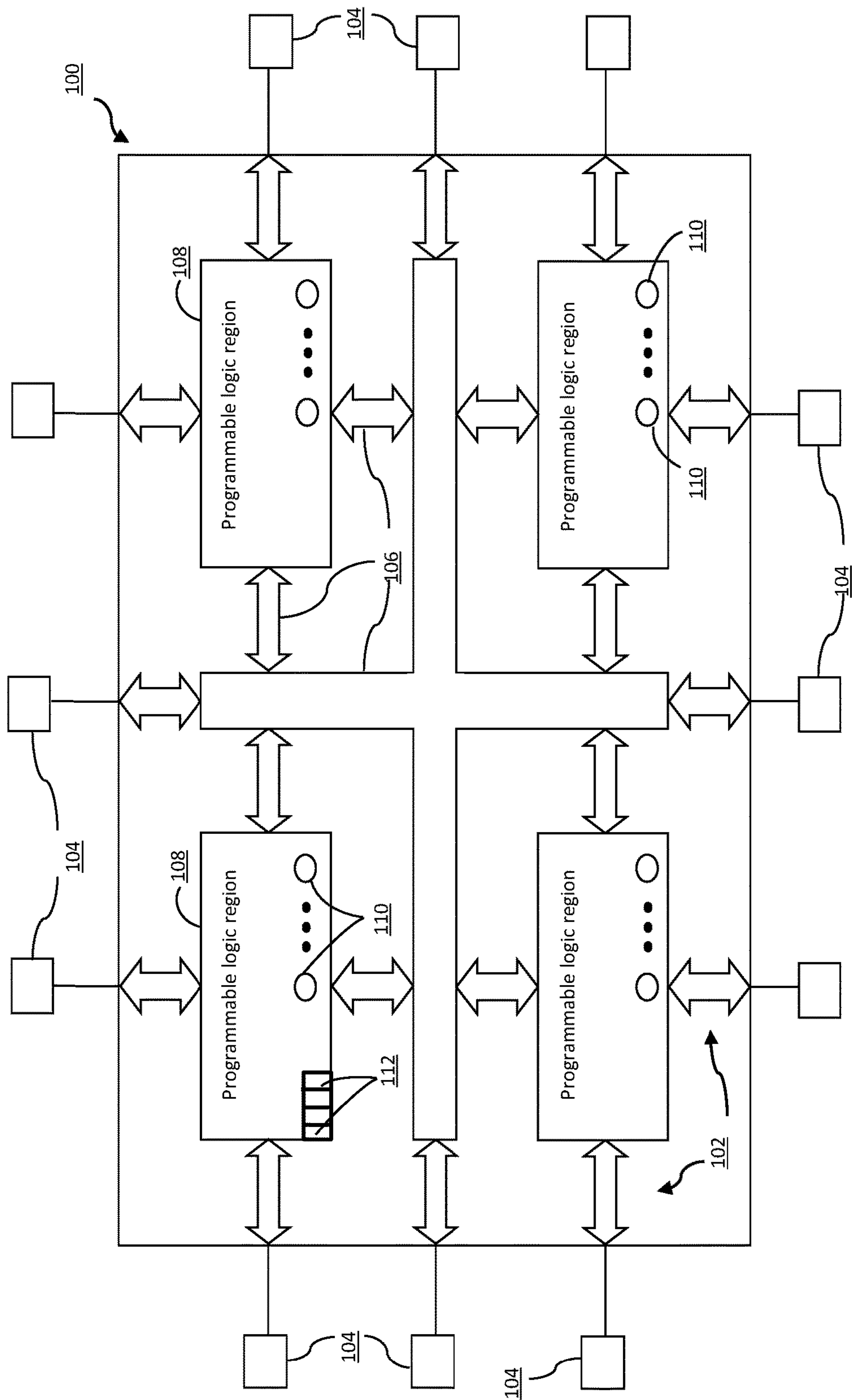
FIG. 1 illustrates an exemplary programmable logic device (PLD) circuit in accordance with an embodiment of the present invention.

FIG. 1 illustrates a programmable logic device circuit in accordance with an embodiment of the present invention. In FIG. 1, a programmable logic device (PLD) circuit 100 may include input-output circuitry 102 for driving signals of device circuit 100 and for receiving signals from other devices via input-output pins 104. Interconnect circuit 106 may comprise resources such as global and local vertical and horizontal conductive lines and buses may be used to route signals on PLD circuit 100. An interconnect circuit 106 includes conductive lines and programmable connections between respective conductive lines and are therefore sometimes referred to as programmable interconnects.

PLD circuit 100 may include programmable logic 108 that can be configured to perform a custom logic function. Programmable logic 108 may include combinational and sequential logic circuitry. Interconnect circuit 106 may be considered to be a type of programmable logic 108.

PLD circuit 100 may also contain programmable memory elements 110. Memory elements 110 can be loaded with configuration data (also called programming data) using pins 104 and input-output circuitry 102. Once loaded, the memory elements may each provide a corresponding static control signal that controls the operation of an associated logic component in programmable logic 108. In a typical scenario, the outputs of the loaded memory elements 110 are applied to the gates of metal-oxide-semiconductor transistors in programmable logic 108 to turn certain transistors on or off and thereby configure the logic in programmable logic 108 and routing paths. Programmable logic circuit elements that may be controlled in this way include pass transistors, parts of multiplexers (e.g., multiplexers used for forming routing paths in interconnect circuit 106), look-up tables, logic arrays, various logic gates, etc.

Memory elements 110 may be implemented using any suitable volatile and/or non-volatile memory structures such as random-access-memory (RAM) cells, fuses, antifuses, programmable read-only-memory memory cells, mask-programmed and laser-programmed structures, resistive memory structures, combinations of these structures, etc. Because memory elements 110 are loaded with configuration data during programming, memory elements 110 are sometimes referred to as configuration memory, configuration RAM (CRAM), or programmable memory elements.

The circuitry of PLD circuit 100 may be organized using any suitable architecture. As an example, the logic of PLD circuit 100 may be organized in a series of rows and columns of larger programmable logic regions each of which contains multiple smaller logic regions. The smaller regions may be, for example, regions of logic that are sometimes referred to as logic elements (LEs), each containing a look-up table (LUT), one or more registers, and programmable multiplexer circuitry. The smaller regions may also be, for example, regions of logic that are sometimes referred to as adaptive logic modules (ALMs). Each adaptive logic module may include a pair of adders, a pair of associated registers and a look-up table or other block of shared combinational logic (as an example). The larger regions may be, for example, logic array blocks (LABs) containing multiple logic elements or multiple ALMs. In the example of FIG. 1, illustrative logic regions 112 (which may be, for example, LEs or ALMs) are shown in one of the larger regions of programmable logic 108 in FIG. 1 (which may be, for example, a logic array block). In a typical PLD circuit 100, there may be hundreds or thousands of smaller logic regions 112. The logic regions 112 that are shown in FIG. 1 are merely illustrative.

During device programming, configuration data is loaded into PLD circuit 100 that configures the programmable logic regions 112 and programmable logic regions 108 so that their logic resources perform desired logic functions on their inputs and produce desired output signals. For example, CRAM cells are loaded with appropriate configuration data bits to configure adders and other circuits on device 100 to implement desired custom logic designs.

The resources of PLD circuit 100 such as programmable logic 108 may be interconnected by interconnect circuit 106. Interconnect circuit 106 generally includes vertical and horizontal conductors. These conductors may include global conductive lines that span substantially all of device 100, fractional lines such as half-lines or quarter lines that span part of PLD circuit 100, staggered lines of a particular length (e.g., sufficient to interconnect several logic array blocks or other such logic areas), smaller local lines, or any other suitable interconnection resource arrangement. If desired, the logic of PLD circuit 100 may be arranged in more levels or layers in which multiple large regions are interconnected to form still larger portions of logic. Still other device arrangements may use logic that is not arranged in rows and columns.

In addition to the relatively large blocks of programmable logic that are shown in FIG. 1, PLD circuit 100 generally also includes some programmable logic associated with the programmable interconnects, memory, and input-output circuitry on PLD circuit 100. For example, input-output circuitry 102 may contain programmable input and output buffers. Interconnect circuit 106 may be programmed to route signals to a desired destination.

Figure 2:
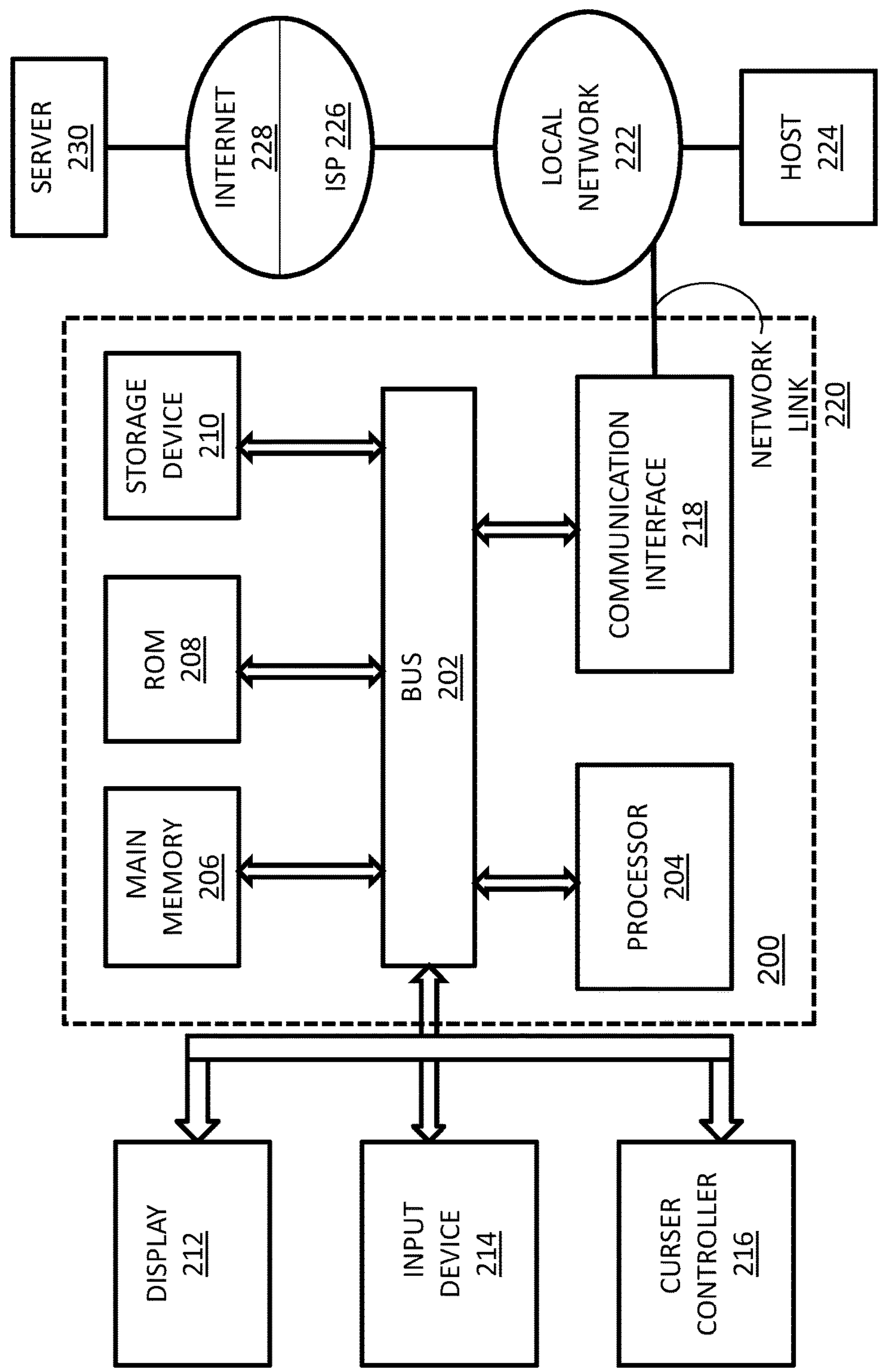
FIG. 2 illustrates an exemplary computer system in accordance with an embodiment of the present invention.

FIG. 2 is a block diagram that illustrates a computer system 200 upon which an embodiment of the invention may be implemented. Computer system 200 includes a bus 202 or other communication mechanism for communicating information, and a hardware processor 204 coupled with bus 202 for processing information. Hardware processor 204 may be, for example, a general-purpose microprocessor. In an embodiment, processor 204 may be similar to processing circuitry 102 described above.

Computer system 200 also includes a main memory 206, such as a random access memory (RAM) or other dynamic storage device, coupled to bus 202 for storing information and instructions to be executed by processor 204. Main memory 206 also may be used for storing temporary variables or other intermediate information during execution of instructions to be executed by processor 204. Such instructions, when stored in non-transitory storage media accessible to processor 204, render computer system 200 into a special-purpose machine that is customized to perform the operations specified in the instructions.

Computer system 200 further includes a read only memory (ROM) 208 or other static storage device coupled to bus 202 for storing static information and instructions for processor 204. A storage device 210, such as a magnetic disk, optical disk, or solid-state drive is provided and coupled to bus 202 for storing information and instructions.

Computer system 200 may be coupled via bus 202 to a display 212 for displaying information to a computer user. An input device 214, including alphanumeric and other keys, is coupled to bus 202 for communicating information and command selections to processor 204. Another type of user input device is cursor control 216, such as a mouse, a trackball, or cursor direction keys for communicating direction information and command selections to processor 204 and for controlling cursor movement on display 212. This input device typically has two degrees of freedom in two axes, a first axis (e.g., x) and a second axis (e.g., y), that allows the device to specify positions in a plane.

Computer system 200 may implement the techniques described herein using customized hard-wired logic, one or more ASICs or FPGAs, firmware and/or PLDs as described in FIG. 1, which in combination with the computer system, causes or programs computer system 200 to be a special-purpose machine. According to one embodiment, the techniques herein are performed by computer system 200 in response to processor 204 executing one or more sequences of one or more instructions contained in main memory 206. Such instructions may be read into main memory 206 from another storage medium, such as storage device 210. Execution of the sequences of instructions contained in main memory 206 causes processor 204 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical disks, magnetic disks, or solid-state drives, such as storage device 210. Volatile media includes dynamic memory, such as main memory 206. Common forms of storage media include, for example, a floppy disk, a flexible disk, hard disk, solid-state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 202. Transmission media can also take the form of acoustic or light waves, such as those generated during radio-wave and infra-red data communications.

Various forms of media may be involved in carrying one or more sequences of one or more instructions to processor 204 for execution. For example, the instructions may initially be carried on a magnetic disk or solid-state drive of a remote computer. The remote computer can load the instructions into its dynamic memory and send the instructions over a telephone line using a modem. A modem local to computer system 200 can receive the data on the telephone line and use an infra-red transmitter to convert the data to an infra-red signal. An infra-red detector can receive the data carried in the infra-red signal and appropriate circuitry can place the data on bus 202. Bus 202 carries the data to main memory 206, from which processor 204 retrieves and executes the instructions. The instructions received by main memory 206 may optionally be stored on storage device 210 either before or after execution by processor 204.

Computer system 200 also includes a communication interface 218 coupled to bus 202. Communication interface 218 provides a two-way data communication coupling to a network link 220 that is connected to a local network 222. For example, communication interface 218 may be an integrated service digital network (ISDN) card, cable modem, satellite modem, or a modem to provide a data communication connection to a corresponding type of telephone line. As another example, communication interface 218 may be a local area network (LAN) card to provide a data communication connection to a compatible LAN. Wireless links may also be implemented. In any such implementation, communication interface 218 sends and receives electrical, electromagnetic or optical signals that carry digital data streams representing various types of information.

Network link 220 typically provides data communication through one or more networks to other data devices. For example, network link 220 may provide a connection through local network 222 to a host computer 224 or to data equipment operated by an Internet Service Provider (ISP) 226. ISP 226 in turn provides data communication services through the world wide packet data communication network now commonly referred to as the "Internet" 228. Local network 222 and Internet 228 both use electrical, electromagnetic or optical signals that carry digital data streams. The signals through the various networks and the signals on network link 220 and through communication interface 218, which carry the digital data to and from computer system 200, are example forms of transmission media.

Computer system 200 can send messages and receive data, including program code, through the network(s), network link 220 and communication interface 218. In the Internet example, a server 230 might transmit a requested code for an application program through Internet 228, ISP 226, local network 222 and communication interface 218.

The received code may be executed by processor 204 as it is received, and/or stored in storage device 210, or other non-volatile storage for later execution.

Figure 3:
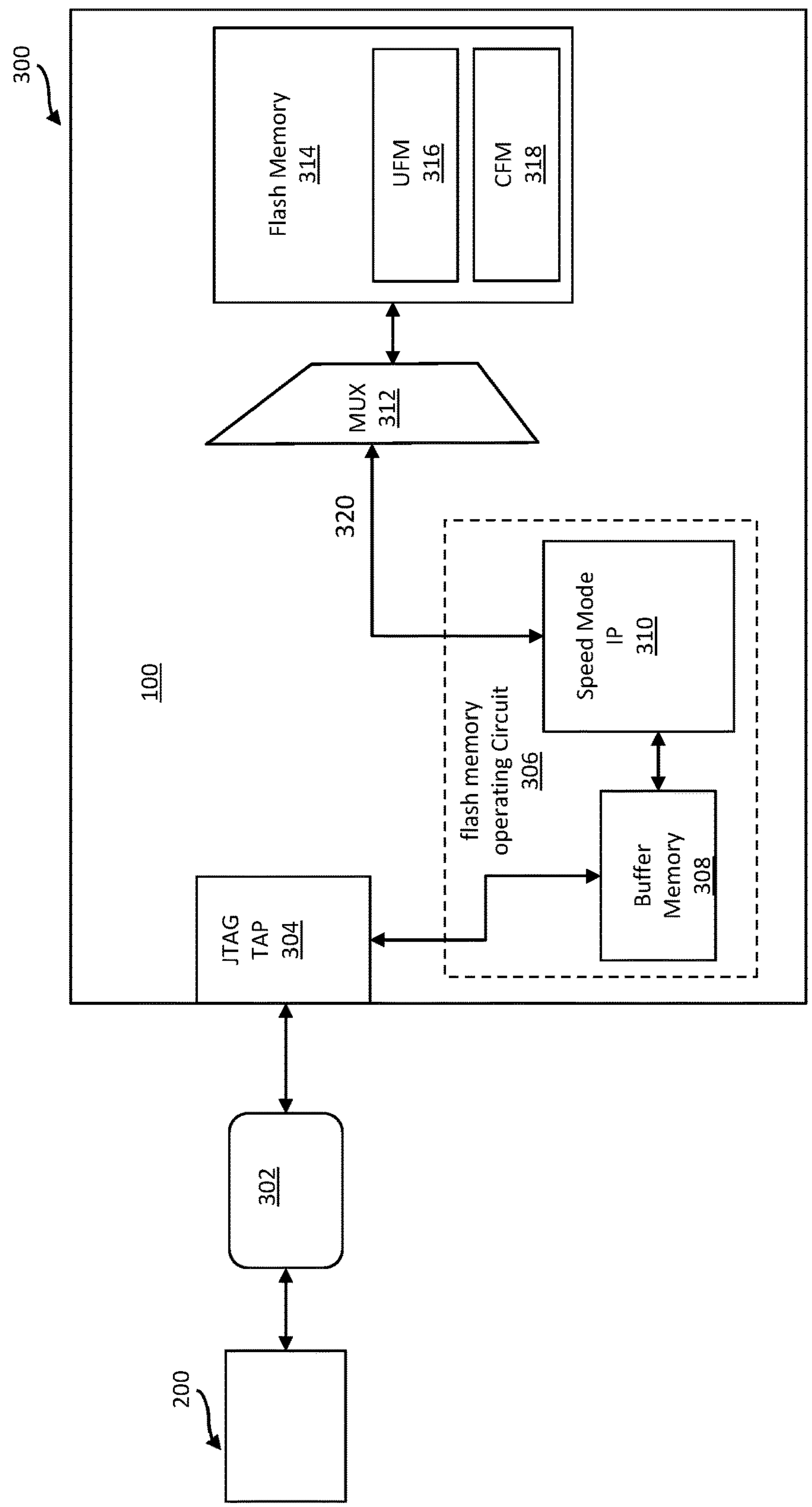
FIG. 3 illustrates an exemplary flash memory programming system in accordance with an embodiment of the present invention.

FIG. 3 illustrates an exemplary flash memory programming system 300 in accordance with an embodiment of the present invention. For the purpose of illustrating clear examples, FIG. 3 will be discussed in reference to integrated circuit 100 of FIG. 1 and computer system 200 of FIG. 2.

Referring now to FIG. 3, computer system 200 may be communicatively coupled to PLD circuit 100 via programming cable 302. Programming cable 302 may implement cable control protocols such as USB blaster, OSCAR JTAG, or Ethernet Blaster. In an embodiment, programming cable 302 may be operating on a pre-defined frequency according to the cable control protocol. In an embodiment, computer system 200 may send flash programming data to PLD circuit 100 via programming cable 302.

Programming cable 302 is communicatively coupled to JTAG TAP 304 of PLD circuit 100. In an embodiment, JTAG TAP 304 has four pins that may receive four different signals. In an embodiment, the four different signals may include Test Clock (TCK), Test Mode Select (TMS), Test Data Input (TDI), and Test Data Output (TDO). In an embodiment, JTAG TAP 304 may have an additional pin such that the additional pin may receive a RESET signal. In an embodiment, JTAG TAP 304 receives programmable data from computer system 200 via programmable cable 302.

JTAG TAP 304 is communicatively coupled to flash memory operating circuit 306. In an embodiment, flash memory operating circuit 306 may further include buffer memory 308 and speed mode IP block 310. In an embodiment, buffer memory 308 may be similar to memory elements 110 of PLD circuit 100 as described above. In an embodiment, buffer memory 308 may act as a buffer to temporarily store flash programming data received from JTAG TAP 304. In an embodiment, buffer memory 308 may be on-chip RAM.

Referring again to FIG. 3, speed mode IP block 310 may be a customized intellectual property (IP) block configured in PLD circuit 100. In an embodiment, flash memory operating circuit 306 may operate as the host to access a flash memory 314 in PLD 100 through internal flash hard-block interface 320. In an embodiment, speed mode IP block 310 is programmed to perform various operations on flash memory 314. In an embodiment, the various operations may include erase flash memory 314, blank-check flash memory 314 to make sure all data in flash memory 314 is reset, program flash memory 314 with flash programming data that is sent from computer system 200, and verify flash memory 314 to check that flash programming data is loaded successfully in flash memory 314.

Referring again to FIG. 3, flash memory operating circuit 306 may be communicatively coupled to flash memory 314 via multiplexer 312. In an embodiment, speed mode IP block 310 drives the appropriate flash memory operation signal to flash memory 314 through multiplexer 312 according to the operation that may be performed on flash memory 314. For example, if speed mode IP block 310 is operable to verify contents of flash memory 314, then speed mode IP block 310 may drive a verify signal to flash memory 314 by asserting the appropriate signal line of multiplexer 312. In an embodiment, flash memory 314 may include user-programmable flash memory 316 (UFM) and configurable flash memory 318 (CFM). In an embodiment, UFM 316 may store user-design data for configuring PLD circuit 100 according to the stored user-design. In an embodiment, CFM 318 may store configuration data. In an embodiment, flash memory operating circuit 306 may be configured via JTAG on PLD circuit 100 at startup. In an embodiment, the speed mode IP block 310 is operable to program flash memory 314.

Figure 4:
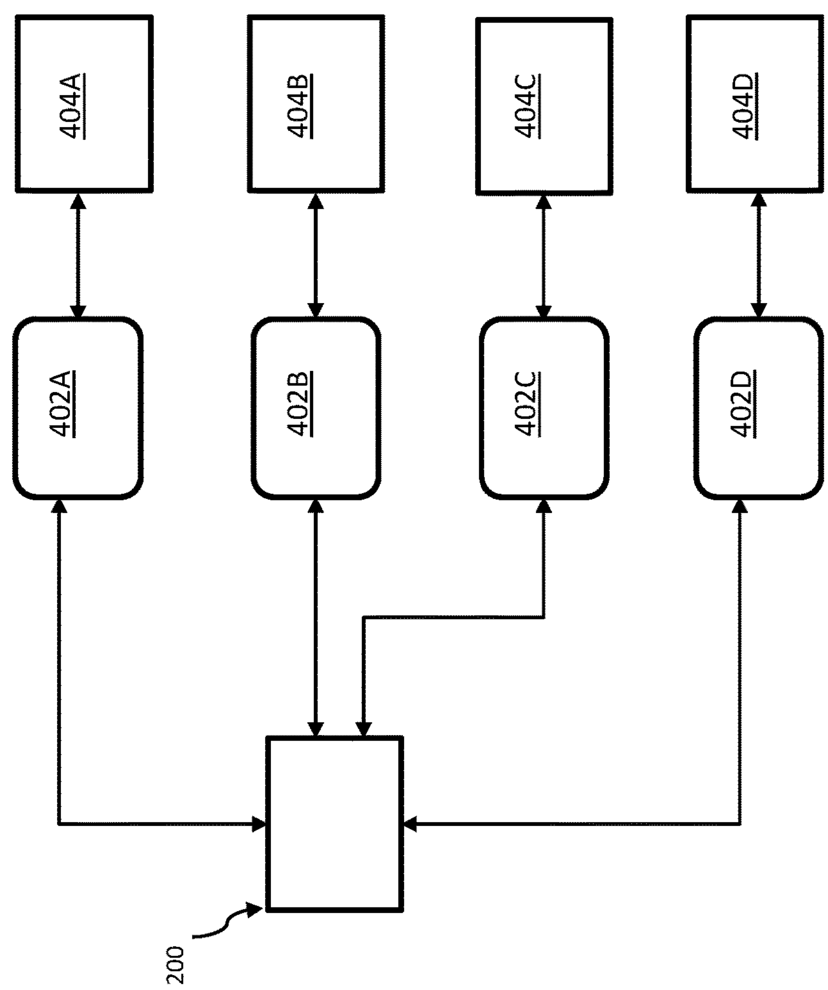
FIG. 4 illustrates an exemplary multi-device flash programming system in accordance with an embodiment of the present invention.

FIG. 4 illustrates an exemplary multi-device flash programming system in accordance with an embodiment of the present invention. For the purpose of illustrating clear examples, FIG. 4 will be discussed in reference to flash programming system 300 of FIG. 3.

Referring now to FIG. 4, computer system 200 is communicatively coupled to host devices 404A, 404B, 404C, and 404D via programming cables 402A, 402B, 402C, and 402D, respectively. In an embodiment, each of programming cables 402A, 402B, 402C, and 402D implements a programming cable control protocol as described above. In an embodiment, each host device 404A-404D may be a PLD circuit similar to PLD circuit 100 described above. In an embodiment, each host device 404A-404D is operable to receive programming data from computer system 200 and program its internal flash memory using its speed-mode IP block. Thus, each host device acts independently of the other host devices, and programming resources are not shared among the host devices to program their internal flash memories.

Figure 5:
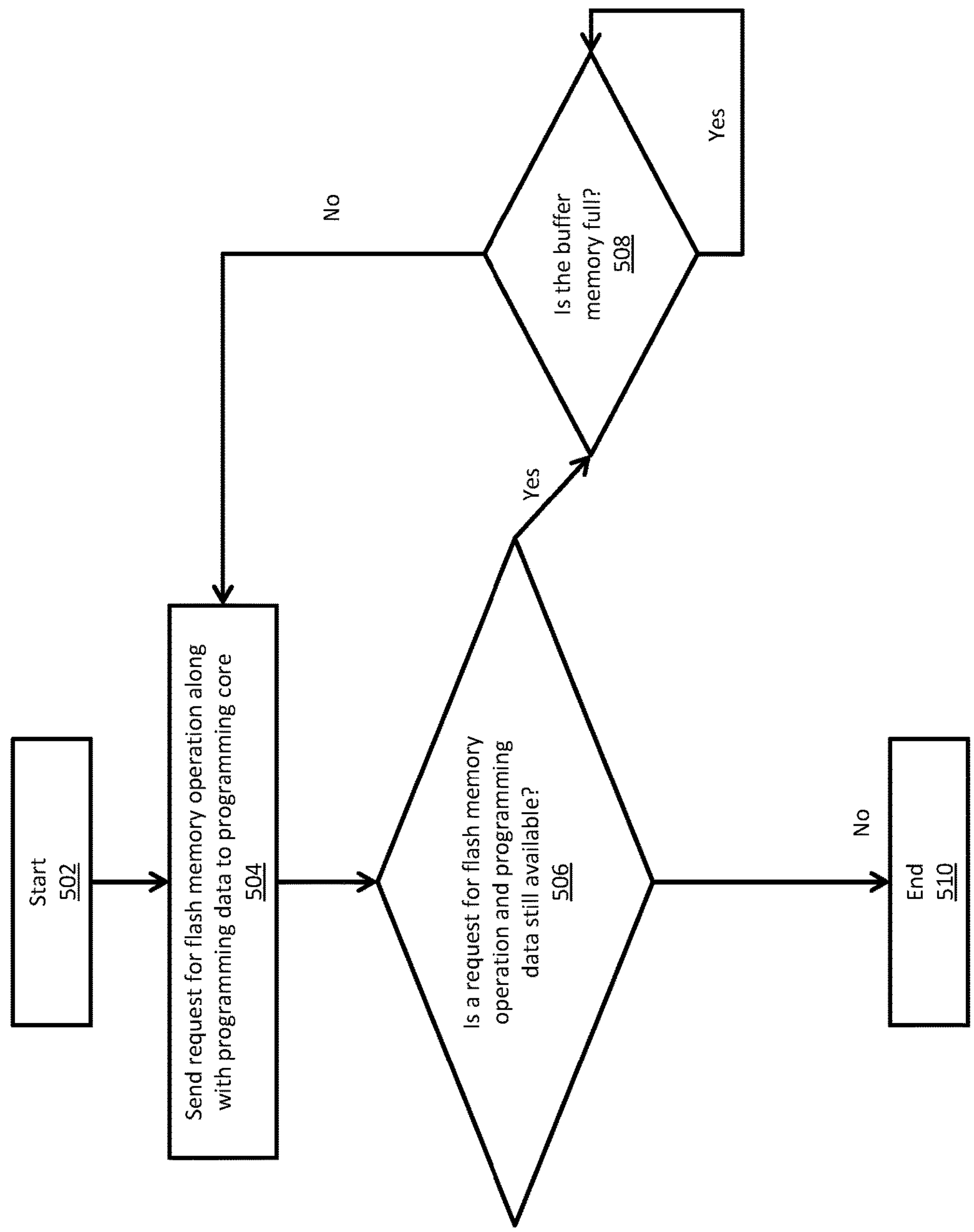
FIG. 5 illustrates an exemplary method of operating a computer system to program a flash memory on an integrated circuit in accordance with an embodiment of the present invention.

FIG. 5 illustrates an exemplary method of operating computer system 200 to program flash memory 314 on PLD circuit 100 in accordance with an embodiment of the present invention. For the purpose of illustrating clear examples, FIG. 5 will be discussed in connection with flash programming system 300 of FIG. 3.

At block 502, flash memory operating circuit 306 is configured to PLD circuit 100 at startup. In an embodiment, flash memory operating circuit 306 may be configured via JTAG. Computer system 200 may then receive one or more requests to perform one or more flash memory operations on flash memory 314 of PLD circuit 100. Computer system 200 may execute a specialized software program (which may be referred to as the programmer engine) to generate a signal to perform the user-requested flash memory operations along with associated flash programming data.

At block 504, the request(s) to perform flash memory operations along with the associated programming data is sent to PLD circuit 100 via programming cable 302 for further processing. In an embodiment, the programmer engine sends the requests to perform flash memory operations by setting the appropriate flash memory operation flags (also referred to as operation flags) in speed mode IP block 310 in flash memory operating circuit 306. In an embodiment, the flags represent a combination of one or more of flash memory operations described above. In an embodiment, flash programming data sent to flash memory operating circuit 306 is buffered in buffer memory 308.

At block 506, the programmer engine determines whether there are any pending flash memory operations or pending programming data that needs to be sent to buffer memory 308. If the programmer engine determines that there are still pending flash memory operations or pending programming data that needs to be sent to buffer memory 308, the process of FIG. 5 proceeds to block 508.

The programmer engine queries buffer memory 308 to determine whether buffer memory 308 is full in block 508. If buffer memory 308 is full, the process of FIG. 5 continues to loop to block 508. The programmer engine will stop sending flash memory operation requests and flash programming data until one or more of the flash memory operation requests are processed by the speed mode IP block 310 to free up buffer space on buffer memory 308. If buffer memory 308 is not full, then the process moves back to block 504.

If the programmer engine determines that there are no pending flash memory operations or pending programming data at block 506, then the process of FIG. 5 moves to block 510 where the flash memory programming is completed and the process ends.

Figure 6:
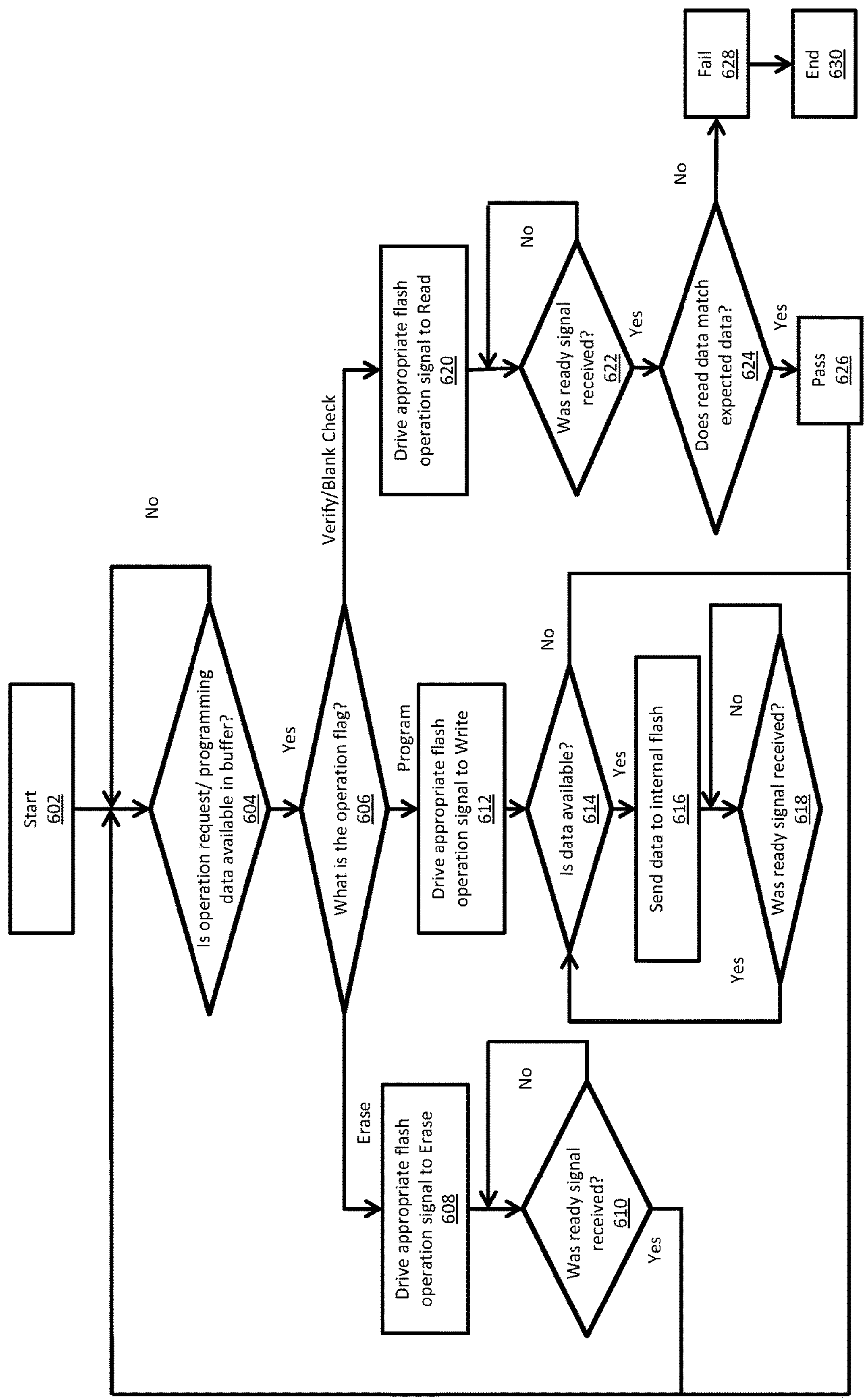
FIG. 6 illustrates an exemplary method of operating a speed-mode IP in an integrated circuit to program a flash memory on the integrated circuit in accordance with an embodiment of the present invention.

FIG. 6 illustrates an exemplary method of operating a speed-mode IP block 310 in PLD circuit 100 to perform flash memory programming operations on flash memory 314 in accordance with an embodiment of the present invention. For the purpose of illustrating clear examples, FIG. 6 will be discussed in connection with flash programming system 300 of FIG. 3.

At block 602, the flash memory operation requests and associated flash programming data are stored in buffer memory 308.

At block 604, the speed mode IP block 310 keeps checking availability of flash memory operations and associated programming data in the buffer. Once speed mode IP block 310 detects that there is a flash memory operation and associated programming data available, speed mode IP block 310 starts the first flash memory operation in buffer memory 308.

At block 606, speed mode IP block 310 determines the operation flags set by the programmer engine through the flash programming request. Speed mode IP block 310 then drives appropriate flash memory operation signals to erase, program, or verify/blank check flash memory 314 to implement the appropriate flash memory operations that are indicated by the operation flags set by the programmer engine.

If the flag is set to erase, then the process of FIG. 6 moves to block 608 and speed mode IP block 310 then drives 'ERASE' signal through multiplexer 312 to flash memory 314 via internal flash hard-block interface 320. Speed mode IP block 310 initiates an erase flash memory operation. In an embodiment, the erase flash memory operation is executed sector by sector in flash memory 314. In an embodiment, the erase operation erases the contents of flash memory 314.

The process then moves to block 610, where speed mode IP block 310 waits for the ready signal from hard block interface 320 to determine whether the erase flash memory operation has been completed. Once the erase operation is completed and the ready signal is received by speed mode IP block 310, the process moves back to block 604 until there is no more flash memory operation requests and associated programming data in the buffer memory 308 to process.

If the flag is set to program, then the process moves from block 606 to block 612, and speed mode IP block 310 then drives 'WRITE' signal through multiplexer 312 to flash memory 314 via internal flash hard-block interface 320. Speed mode IP block 310 initiates write flash memory operation. In an embodiment, the write flash memory operation is executed sector by sector in flash memory 314. In an embodiment, the write operation writes the associated programming data to flash memory 314.

The process then moves to block 614, to determine if there is programming data associated with the program request. If there is data available to write to flash memory 314, the process moves to 616.

At block 616, the speed mode IP block 310 sends data to write to flash memory 314. In an embodiment, the data may be written in 32-bit sized chunks to flash memory 314.

The process then moves to block 618, where speed mode IP block 310 waits for the ready signal from hard block interface 320. If the ready signal is received, then the process moves back to block 614 to check if more data is available to continue the write flash memory operation. If no data is available, then the program operation is completed, and the process moves back to block 604 until there are no more flash memory operation requests and associated programming data in the buffer memory 308 to process.

If the flag is set to verify or blank check at block 606, then the process moves from block 606 to block 620, and speed mode IP block 310 then drives 'READ' signal through multiplexer 312 to flash memory 314 via internal flash hard-block interface 320. Speed mode IP block 310 initiates a read flash memory operation. In an embodiment, the read flash memory operation is executed sector by sector in flash memory 314.

The process then moves to block 622, where speed mode IP block 310 waits until the ready signal is received from hard block interface 320. Once the ready signal is received, it may indicate that there may be no more data in flash memory 314 to be read, and the process moves to block 624.

At block 624, speed mode IP block 310 verifies the data read from flash memory 314 by checking it against expected data. In an embodiment where the flag is set to 'blank check,' speed mode IP block 310 verifies whether all data in flash memory 314 is set to '1.' If there is a match between data read from flash memory 314 and expected data, the process moves to block 626. If the read data and expected data do not match, then the process moves to block 628.

At block 626, an output signal indicating that the data has been successfully verified is generated by speed mode IP block 310 and sent back to computer system 200. The process then moves back to block 604 until there are no more flash memory operation requests and associated programming data in the buffer memory 308 to process. At block 628, an output signal indicating that the data was not successfully verified is generated by speed mode IP block 310 and sent back to computer system 200. The process then moves to block 630 where all flash memory operations may be considered complete and the process ends.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction. Any definitions expressly set forth herein for terms contained in such claims shall govern the meaning of such terms as used in the claims.

What is claimed is:

1. An integrated circuit comprising:

a buffer memory;

a speed mode intellectual property (IP) block, wherein the speed mode IP block is communicatively coupled to the buffer memory, and wherein the buffer memory and the speed mode IP block are part of a flash memory operating circuit in the integrated circuit; and a flash memory, wherein the flash memory operating circuit operates as a host to access the flash memory, wherein the speed mode IP block determines an operation flag set by a programmer engine through a request to perform a flash memory operation, and wherein the speed mode IP block performs the flash memory operation on the flash memory in the integrated circuit that is indicated by the operation flag set by the programmer engine.

2. The integrated circuit as defined in claim 1, wherein the speed mode IP block erases the flash memory, programs the flash memory with programming data, and verifies data stored in the flash memory as indicated by operation flags set by the programmer engine.

3. The integrated circuit as defined in claim 1, wherein the integrated circuit is an application specific integrated circuit, an application-specific standard product, a field-programmable gate array, a complex programmable logic device, or a system-on-chip.

4. The integrated circuit as defined in claim 1, wherein the integrated circuit is communicatively coupled to a computer system via a hardware programming cable.

5. A method of performing a flash memory operation on an integrated circuit comprising:

checking availability of programming data in a buffer memory in the integrated circuit using a speed mode intellectual property (IP) block in the integrated circuit;

checking a flash memory operation flag using the speed mode IP block, wherein the flash memory operation flag is set by a programmer engine and determines the flash memory operation to be performed by the speed mode IP block on a flash memory in the integrated circuit;

driving a flash memory operation signal to the flash memory using the speed mode IP block to implement the flash memory operation on the flash memory that is indicated by the flash memory operation flag set by the programmer engine; and executing the flash memory operation on each sector of the flash memory using the speed mode IP block.

6. The method as defined in claim 5 further comprising:

receiving a feedback signal from the flash memory using the speed mode IP block, wherein the feedback signal indicates that the flash memory operation is complete.

7. The method as defined in claim 6, wherein the feedback signal further indicates that the speed mode IP block is ready to execute a subsequent flash memory operation.

8. The method as defined in claim 5, wherein the buffer memory and the speed mode IP block are communicatively coupled in a flash memory operating circuit on the integrated circuit.

9. The method as defined in claim 5, wherein the flash memory operation indicated by the flash memory operation flag comprises: erasing the flash memory, programming the flash memory with the programming data, and verifying data stored in the flash memory.

10. The method as defined in claim 9, wherein erasing the flash memory further comprises:

driving an erase signal to the flash memory using the speed mode IP block;

executing an erase operation using the speed mode IP block, wherein the erase operation erases the data stored in the each sector of the flash memory.

11. The method as defined in claim 9, wherein programming the flash memory with the programming data further comprises:

driving a write signal to the flash memory using the speed mode IP block;

executing a write operation using the speed mode IP block, wherein the write operation writes the programming data from the buffer memory to the flash memory.

12. The method as defined in claim 9, wherein verifying the data stored in the flash memory further comprises:

driving a read signal to the flash memory using the speed mode IP block;

executing a read operation using the speed mode IP block, wherein the read operation reads the data stored in the flash memory; and generating a data verified signal according to comparing the data stored in the flash memory to expected data.

13. The method as defined in claim 5, wherein the flash memory operation signal is based on the flash memory operation flag and availability of the programming data in the buffer memory.

14. The method as defined in claim 5 further comprising:

configuring the speed mode IP block in the integrated circuit using a computer system;

sending a plurality of flash memory operation flags to the speed mode IP block using the computer system;

sending the programming data to the buffer memory in response to identifying availability of unoccupied memory space in the buffer memory using the computer system.

15. The method as defined in claim 14, further comprising:

halting the sending of the programming data to the buffer memory in response to identifying absence of unoccupied memory space in the buffer memory using the computer system.

16. A system for programming a flash memory in an integrated circuit comprising:

a computer system, wherein the computer system is communicatively coupled to the integrated circuit, and wherein the computer system sends flash memory operation flags and programming data to the integrated circuit; and the integrated circuit comprising the flash memory and flash memory operating circuitry communicatively coupled to the flash memory, wherein the flash memory operating circuitry comprises:

a buffer memory, wherein the buffer memory stores the programming data received from the computer system; and a speed mode intellectual property (IP) block, wherein the speed mode IP block determines the flash memory operation flags set by the computer system through a request to perform flash memory operations, and wherein the speed mode IP block performs the flash memory operations on the flash memory according to the programming data and the flash memory operation flags received from the computer system.

17. The system as defined in claim 16, wherein the computer system is communicatively coupled to the integrated circuit using a hardware programming cable.

18. The system as defined in claim 17, wherein the hardware programming cable is a universal serial bus (USB) cable.

19. The system as defined in claim 16, wherein the computer system is communicatively coupled to a second integrated circuit, and wherein the second integrated circuit comprises a second flash memory communicatively coupled to second flash memory operating circuitry.

20. The system as defined in claim 16, wherein the speed mode IP block is communicatively coupled to the buffer memory.

* * * * *